US005533132A

United States Patent [19]

Button

[11] Patent Number: 5,533,132

[45] Date of Patent: Jul. 2, 1996

[54] LOUDSPEAKER THERMAL MANAGEMENT STRUCTURE

[75] Inventor: Douglas J. Button, Champaign, Ill.

[73] Assignee: JBL Incorporated, Northridge, Calif.

[21] Appl. No.: 377,038

[22] Filed: Jan. 23, 1995

[51] Int. Cl.$^6$ .............................. H04R 1/02; H05K 7/20

[52] U.S. Cl. .............................. 381/90; 381/87; 381/159; 181/199; 361/688; 361/697; 361/703; 361/704

[58] Field of Search .............................. 381/90, 87, 88, 381/158, 153, 188, 159, 205; 181/199, 224, 156; 361/687, 688, 690, 694–697, 703, 704, 707

[56] References Cited

U.S. PATENT DOCUMENTS

| | | | |
|---|---|---|---|
| 3,462,553 | 8/1969 | Spranger | 381/90 |
| 3,778,551 | 12/1973 | Grodinsky | 381/90 |
| 4,210,778 | 7/1980 | Sakurai et al. | 381/159 |
| 4,565,905 | 1/1986 | Nation | 381/186 |
| 4,625,328 | 11/1986 | Freadman | 381/111 |
| 4,811,403 | 3/1989 | Henricksen et al. | 381/159 |
| 5,173,575 | 12/1992 | Furukawa | 381/159 |
| 5,311,928 | 5/1994 | Marton | 361/703 |

FOREIGN PATENT DOCUMENTS

| | | | |
|---|---|---|---|
| 369195 | 3/1991 | Japan | 361/690 |

*Primary Examiner*—Forester W. Isen
*Assistant Examiner*—Xu Mei
*Attorney, Agent, or Firm*—J. E. McTaggart

[57] ABSTRACT

Total thermal management accomplishes self-cooling from acoustic air movement in a light-weight loudspeaker system for professional sound applications: a cast aluminum front panel, forming the front baffle portion of a total enclosure, is configured to include on the front panel a horn opening, a woofer opening with a ring mount for a conventional woofer cone, a pair of bass reflex ports, and, extending rearwardly, a woofer frame with a mount for a conventional woofer driver, a horn structure with a threaded mount for a conventional horn driver, and an amplifier mounting shelf, all thermally combined by a pattern of generally vertical integral cooling vanes. The lower portions of the vanes are shaped to form structural legs of the woofer frame, and their upper portions are integrally attached to the horn. A shelf for mounting an amplifier in the speaker enclosure is formed by a transverse cooling vane. All of the heat-producing devices are thermally connected via good heat-conduction paths provided by the vanes attached integrally to densely-vaned cooling grilles forming the tuned reflex ports; thus, as the woofer is energized, air moves in and out of the grilles at high velocity particularly at low frequency resonance, acting like a fan on the grilles and thus enhancing their thermal dissipation with a cooling effect that increases as the woofer plays louder due to the increased velocity of the reciprocal air movement.

11 Claims, 2 Drawing Sheets

LOUDSPEAKER THERMAL MANAGEMENT STRUCTURE

FIELD OF THE INVENTION

The present invention relates to the field of acoustic loudspeakers and more particularly it relates to a total thermal management system for dissipating heat from a loudspeaker and associated components in an enclosure for professional sound systems in a manner that improves performance while reducing cost and weight by utilizing air movement produced by the loudspeaker for heat dissipation that increases in efficiency with the sound pressure level.

BACKGROUND OF THE INVENTION

Many components in loudspeaker systems create heat: these can include an amplifier, crossover components, low frequency driver, high frequency driver, and transformer, each of which are conventionally designed to dissipate heat in a different manner. Generally the heat generated in each of these components increases with the loudness level.

DISCUSSION OF RELATED KNOWN ART

U.S. Pat. No. 4,811,403 to Henricksen et al discloses mounting of one or more loudspeakers in thermal engagement with a load bearing member of good thermal conductivity which is in turn attached to rigid lightweight enclosure.

U.S. Pat. No. 4,210,778 to Sakurai et al discloses a loudspeaker with a heat pipe having a lower end disposed in the drive means and an upper end disposed in a front panel exit opening in the reflex port, for removing heat from the drive means by gravity air flow through the heat pipe.

U.S. Pat. No. 4,138593 to Hasselbach et al addresses improvements in heat removal from a loudspeaker by thermally engaging the driver means to portions of the speaker housing, either by the addition of internal heat removal structure, e.g. extending from the rear of the magnet to the rear housing panel and/or by constructing the speaker frame and sound panel in one piece of thermally conductive material.

U.S. Pat. No. 3,991,286 to Henrickson discloses a loudspeaker having a voice coil, spider suspension and speaker frame all made of material having high thermal conductivity, including a horn type speaker embodiment with a thermally conductive horn element and a heat sink member attached on the rear.

U.S. Pat. No. 4,757,547 to Danley discloses an electrical blower passing cooling air through a loudspeaker driver.

U.S. Pat. No. 4,993,975 to Button, the present inventor, discloses a loudspeaker structure with means for conducting heat outwardly from the magnetic gap comprising a cylindrical collar confronting the voice coil former having radial vanes extending outwardly to a circular ring integral with the frame of the loudspeaker.

Unlike the foregoing patents, the following patents are directed to amplifier cooling and fail to address loudspeaker cooling:

U.S. Pat. No. 3,909,679 to Petri discloses a solid state amplifier utilizing a cast aluminum chassis mounted in an opening in the rear wall of an internally sealed cabinet with heat convecting fins of the chassis extending outwardly.

U.S. Pat. No. 3,778,551 to Grodinsky discloses an air cooled audio amplifier assembly mounted onto an upper region of a speaker cabinet; air passages from the speaker cavity within the cabinet communicate with transistor heat sinks of the amplifier so that the speaker cone serves as a pump for cooling air that passes across the heat sinks.

U.S. Pat. No. 3,462,553 to Spranger discloses a solid state amplifier and control panel assembly in a rectangular sheet metal enclosure cooperating with wood frame means to define a loudspeaker chamber, the sheet metal enclosure extending outwardly from the main body of the wooden loudspeaker chamber and having perforations on top and bottom panels above and below vaned heat sinks carrying transistors of the amplifier so as to provide upward cooling air flow past the heat sinks.

A common approach in known art of thermal management in the design of high power professional loudspeakers consists of simply making the driver structure exceptionally massive in size and weight, accepting these excesses along with the resulting cost increase as disadvantages of a tradeoff perceived as unavoidable.

OBJECTS OF THE INVENTION

It is a primary object of the present invention to provide, for a professional sound system, a low cost light weight loudspeaker assembly containing heat-producing devices such as speaker drivers, amplifiers, crossover components, power supplies and the like, featuring a heat dissipation system that uses a unified mechanism to dissipate the heat that is generated by all of the devices.

It is a further object for the heat dissipation mechanism to be enhanced by the operation of the speaker, such that the cooling effect increases as a function of loudness.

SUMMARY OF THE INVENTION

The abovementioned objects have been accomplished in a loudspeaker assembly comprising an enclosure of lightweight thermally conductive metal, e.g. die-cast aluminum, that is a single part which incorporates the following functions: front baffle portion of the speaker enclosure, woofer frame, woofer driver mount and heatsink, high frequency horn, compression horn driver mount and heatsink, amplifier mount and heatsink, and low frequency tuned port system. To provide the key heat dissipation mechanism, heat sink vanes are located in the low frequency port system, which in a preferred embodiment comprises a symmetrical pair of ports, so that as the speaker is energized by low frequency signals air moves in and out of the ports at high velocity across the vanes. This acts like a fan on the vaned heat sink, providing a substantial increase in the thermal dissipation characteristic of the vanes; the cooling effect increases as the woofer plays louder due to the increased velocity of the air movement. Another important feature of this total thermal management system is that all of the devices are connected by good heat conduction paths to the ports, located on the periphery inside the box. An amplifier or other heat-producing device can be mounted in the box in the vicinity of the port region with all devices funneling the heat into the ports which are then cooled by the low frequency air resonance.

BRIEF DESCRIPTION OF THE DRAWINGS

The above and further objects, features and advantages of the present invention will be more fully understood from the following description taken with the accompanying drawings in which.

DETAILED DESCRIPTION

Figure 1A:
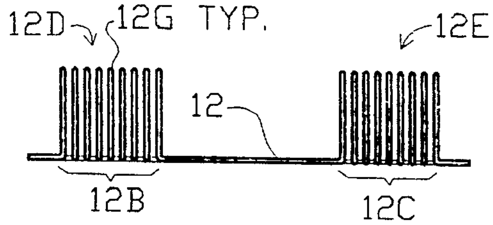
FIG. 1A is a cross-sectional view through axis 1A-1A' of the panel unit of FIG. 1, showing the integral cooling vane grilles traversing the reflex ports.
Figure 1:
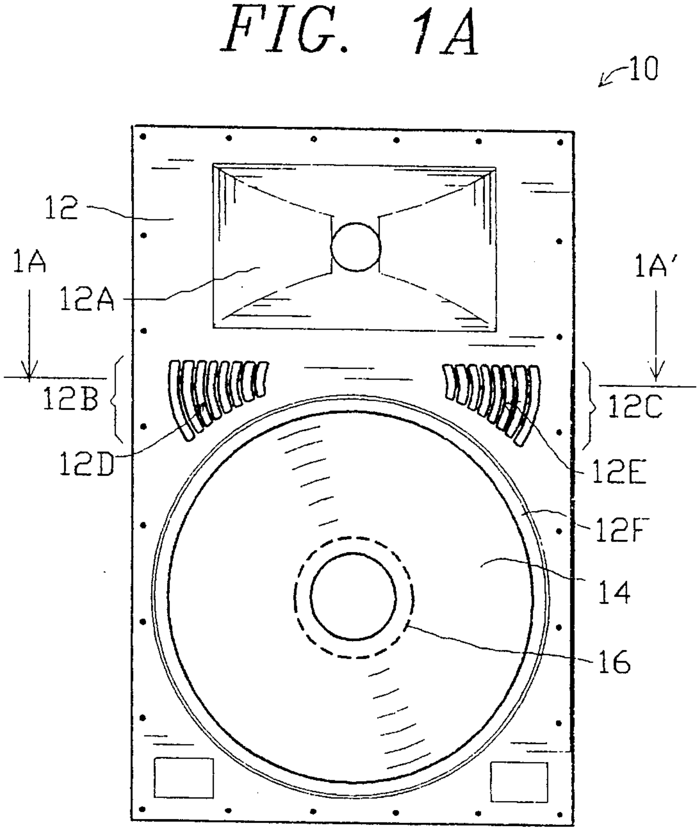
FIG. 1 is a front elevational view of a loudspeaker assembly utilizing a unified speaker panel unit of the present invention integrally formed to provide a high frequency horn, reflex ports with cooling vane grilles, and woofer region, shown with a cone installed.

In FIG. 1, a front elevational view of a loudspeaker assembly 10 of the present invention wherein a front panel unit 12, preferably die-cast from aluminum, is formed integrally to act as a front baffle board and to provide a horn structure 12A, a pair of openings defining reflex ports 12B and 12C traversed by cooling vane grilles 12D and 12E, a round woofer opening defined by a peripheral edge ring 12F providing a mounting surface to which is attached a speaker cone 14 and voice coil of a permanent magnet woofer driver 16 of known art, shown in dashed outline.

FIG. 1A is a cross-sectional view through axis 1A-1A' of the panel unit 12 of FIG. 1, showing grilles 12D and 12E formed from arrays of vanes 12G extending across the regions of the reflex ports 12B and 12C. Typically the vanes 12G are configured in greater density in these grilles 12D and 12E than elsewhere in order to obtain good heat exchange to the air.

Figure 1C:
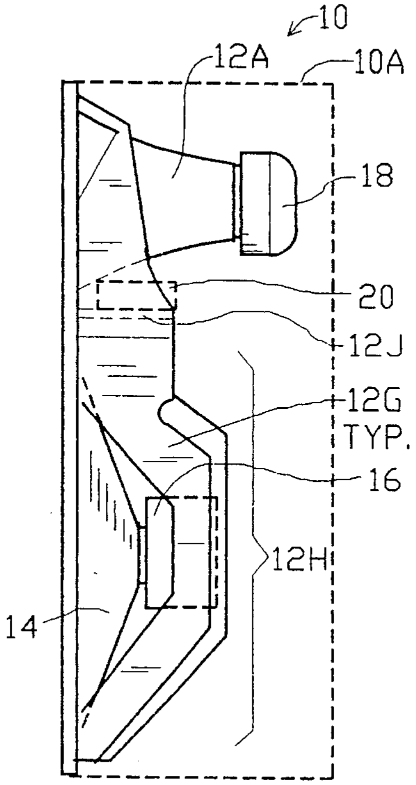
FIG. 1C is a side view of the loudspeaker assembly of FIG. 1, showing profiles of the horn structure, amplifier shelf and vaned woofer structure, and showing, in dashed outline: a horn driver, amplifier, woofer driver and main enclosure.
Figure 1B:
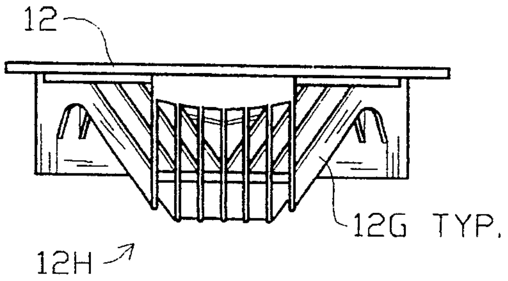
FIG. 1B is a bottom view of the panel unit of FIG. 1, showing the woofer frame formed from integral cooling vanes.

FIG. 1B is a bottom view of the panel unit 12 of FIG. 1, showing a woofer frame 12H formed mainly from vanes 12G formed perpendicular to the front plane of panel unit 12, as in FIG. 1A.

FIG. 1C is a side elevational view of assembly 10 of FIG. 1, showing the profile of the woofer frame 12H, cone 14, a woofer driver 16, shown partially in dashed outline, secured structurally in a recessed mounting region formed as part of woofer frame 12H integral with vanes 12G which are seen to extend virtually the full panel height, from the bottom of the woofer frame 12H upwardly through the grilles in the port region and then joining the horn structure 12A and continuing to the top of panel unit 12. A compression horn driver 18 of known art is attached to horn structure 12A by known threaded means.

An amplifier mounting shelf 12J is formed just below the horn structure 12A and above the ports: the shelf 12J can support an amplifier 20 as shown in dashed outline, serving as a heat sink.

A main enclosure 10A, shown in dashed outline, is attached around the edge of panel unit 12 in a substantially air tight manner by regular screw means.

Figure 2:
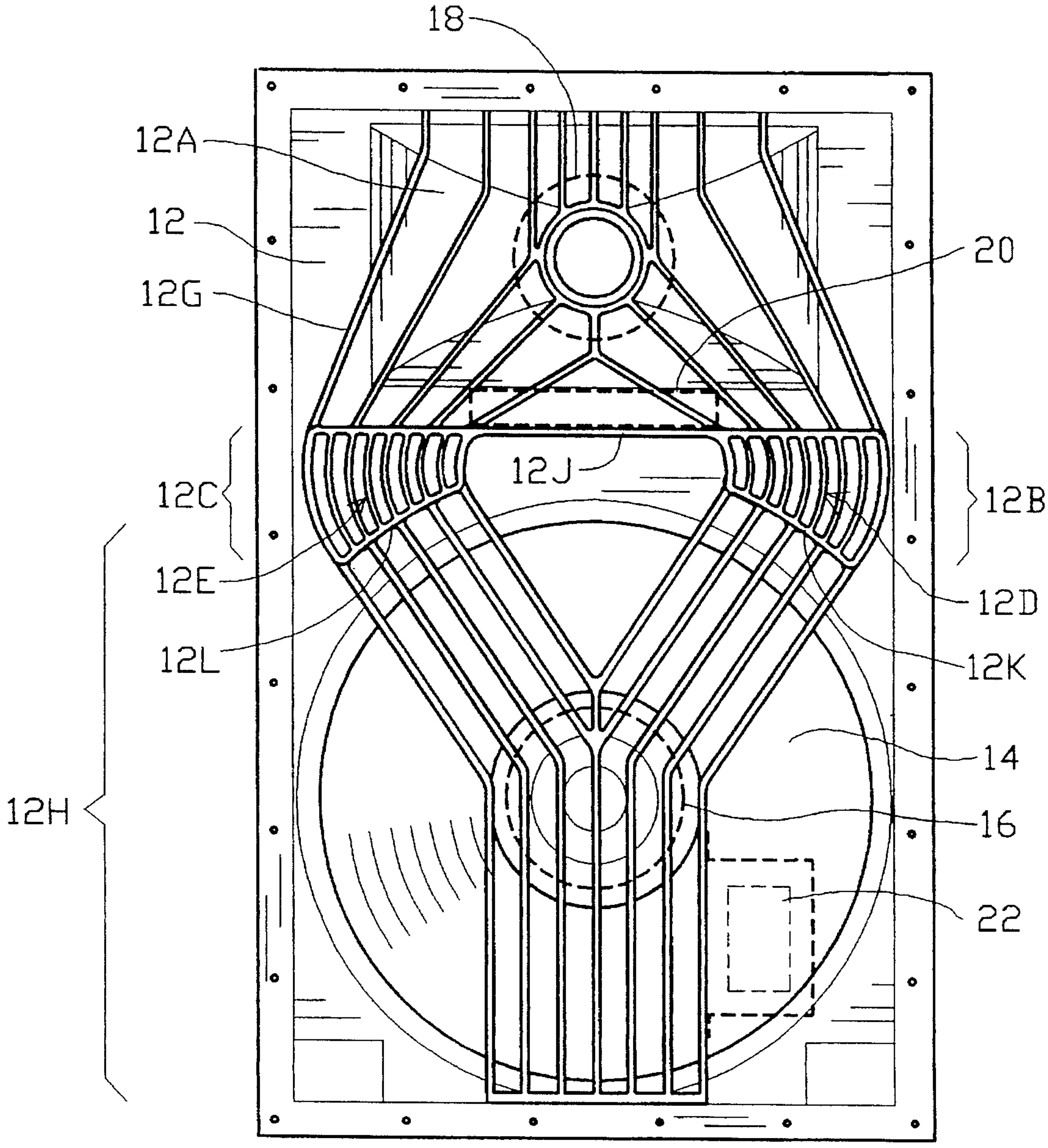
FIG. 2 is a rear view of the panel unit of FIG. 1 showing the pattern of the integral cooling vanes engaging the horn, ports, woofer and the rear plane of the panel.

FIG. 2 is an enlarged rear view of panel unit 12 of assembly 10 (FIG. 1) showing the horn structure 12A and the woofer frame 12H formed integrally from vanes. Vane 12G is typical of the vanes, which extend from bottom to top and which are joined integrally to the rear of the panel unit 12 wherever practicable. The vanes effectively span the ports 12D and 12E where they become part of the vane grilles 12D and 12E. The amplifier mounting shelf 12J is a transverse web vane extending across the top of vane grilles 12D and 12E which thus provide good thermal coupling to cool the amplifier along with the thermal coupling to the front plane of panel unit 12. The bottoms of the vane grilles 12D and 12E are defined by transverse web vanes 12K and 12L. Thus the grilles with top, bottom and side walls, define a ducted tuned bass reflex port.

It is noted that additional vanes are provided in an interleaved manner in each of the vane grilles 12D and 12E: these effectively double the vane surface area in the regions in ports 12B and 12C so as to enhance the vane-to-air heat transfer.

In woofer structure 12H the vanes are seen to extend downwardly in a single cluster to form a lower structural leg of the woofer frame 12H, and to divide into two clusters diverging upwardly to form two upper structural legs of woofer frame 12H. Because of good heat sinking thus provided by the woofer frame 12H, a small neodymium magnet structure can be used in the woofer driver 16.

Above the grilles 12D and 12D the vanes join the horn structure 12A: the outline of horn driver 18 is shown as a dashed line only, in order to show how the vanes are webbed onto the horn mount throat region for effective heat transfer from driver 18.

Some of the heat generated by the two speaker drivers and other heat-generating components located in the speaker enclosure is conducted to the die cast aluminum panel unit 12 via the vanes and thus will dissipate to the surrounding air directly from the outside of the panel unit 12; however, particularly when the woofer cone 14 is driven at high sound levels at low frequencies, air will be pumped back and forth past the vanes in the vane grilles 12D and 12E, thus providing a cooling effect that increases in effectiveness with the audio power level.

A power transformer, e.g. associated with an amplifier, maybe be mounted on one of the vanes of the woofer frame structure 12H as shown in dotted outline 22.

The principle of acoustic air-cooling of vanes extending across the bass reflex ports of a speaker enclosure can be applied to enhance heat removal from any additional heat-producing components located within the speaker enclosure by coupling such components thermally to the vane structure.

In an alternative configuration of woofer frame structure 12H, instead of the single lower structural leg described above, the vanes in that region may be divided into two separate vane clusters diverging downwardly so as to form an X-shaped woofer frame structure.

Although a two-way speaker system is shown in the illustrative embodiment, the self-cooling principle of the present invention can be beneficially applied as well to other speaker systems utilizing a single loudspeaker and to those utilizing more than two loudspeakers.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A loudspeaker assembly that is thermally managed to accomplish self-cooling from acoustic air movement, comprising:

an enclosure having acoustic port means and a diaphragm opening defining a diaphragm-mounting ring, said enclosure being made otherwise substantially air-tight;

a vibrational acoustic diaphragm mounted in the diaphragm-mounting ring in a substantially air-tight manner;

electrical driving means, operationally coupled to said diaphragm for generating sound, disposed within said enclosure, said driving means manifesting a source of heat;

thermally-conductive driver mounting means structurally and thermally coupled with said driving means;

frame means, extending rearwardly from a region of said enclosure surrounding the diaphragm opening, holding said driver mounting means structurally secured to said enclosure; and a plurality of thermally-conductive cooling vanes in thermal engagement with said driver mounting means and traversing the port means such that reciprocal air movement in the port means from vibration of said diaphragm exerts a cooling effect on said electrical driving means via a thermal path through said cooling vanes and said driver mounting means, the cooling effect increasing with sound level.

2. The loudspeaker assembly as defined in claim 1 wherein said enclosure comprises:

a rigid front panel unit, made from metal having high thermal conductivity, configured to form integrally (a) the diaphragm opening and diaphragm-mounting ring, (b) said frame means implemented as a loudspeaker frame structure providing said driver mounting means and having a plurality of clusters of generally vertical cooling vanes, serving as structural leg members of the frame structure, extending from said driver mounting means to a region of said panel unit surrounding the diaphragm opening, and (c) the port means, disposed generally above the frame structure, said cooling vanes extending rearwardly from said front panel perpendicular thereto and extending generally in a vertical direction and traversing the port means; and a main loudspeaker enclosure portion attached in an airtight manner around a peripheral region of said front panel unit so as to extend rearwardly therefrom.

3. The loudspeaker assembly as defined in claim 2 wherein said front panel unit is cast from aluminum to include said frame structure and said cooling vanes formed integrally therewith.

4. The loudspeaker assembly as defined in claim 3 wherein said front panel unit is configured to be substantially rectangular and vertically elongated.

5. The loudspeaker assembly as defined in claim 4 wherein the port opening means comprises a pair of port openings disposed generally above said frame structure and disposed symmetrically toward opposite side edges of said front panel unit, said cooling vanes being configured to form at least three leg support members of said frame structure, extending from a driver region to a surrounding region of said panel unit, including an upwardly diverging pair of vane clusters, each cluster forming a structural upward leg member of said frame structure and each cluster extending upwardly therefrom and traversing a corresponding one of the port openings.

6. The loudspeaker assembly as defined in claim 4, wherein said acoustic diaphragm and associated driving means are configured to function as a woofer for operation at low audio frequencies, said loudspeaker assembly further comprising:

an acoustic horn structure formed integrally in said front panel unit in an upper region thereof, extending inwardly and converging to inward portion formed as a horn driver coupling means; and electro-acoustic horn driving means attached to the horn structure via the horn driver coupling means and thusly engaged operationally and thermally with said horn structure;

said cooling vanes being made to extend upwardly and to integrally join said acoustic horn structure in thermally-conductive engagement therewith so as to enhance heat removal from said horn driving means in a thermal path through the driver coupling means and said horn structure to the cooling vanes.

7. The loudspeaker assembly as defined in claim 6 wherein the port opening means comprise a pair of port openings disposed in said front panel unit generally above said frame structure, below said horn structure and disposed symmetrically toward opposite side edges of said front panel unit, said cooling vanes being configured to divide from a single cluster into an upwardly divergent pair of clusters each traversing a corresponding one of the port openings, said cooling vanes being configured to extend further upwardly from the ports and thence integrally join said horn structure and an upper region of said front panel unit in thermal engagement therewith.

8. The loudspeaker assembly as defined in claim 3 further comprising an electronic amplifier in thermal communication with said cooling vanes and said front panel unit so as to enhance heat removal from said amplifier via reciprocal air movement past said cooling vanes.

9. The integrated speaker construction as defined in claim 8 further comprising a mounting shelf formed integrally with said vanes as a transverse web vane member extending across said front panel unit along a top boundary of the port means, said amplifier being mounted on a central region of said mounting shelf.

10. The integrated speaker construction as defined in claim 5 further comprising in each of two regions of said vanes traversing said port openings:

a first transverse web vane forming a ceiling of the port opening and forming integrally-joined intersections with said vanes traversing the port opening;

a second transverse web vane forming a floor of the port opening and forming integrally-joined intersections with said vanes traversing the port opening; and a plurality of additional vane members interleaved between said vanes and having ends integrally joined to said first and second transverse web vanes, thus forming a vane grille encompassing the port opening and providing enhancement of heat dissipation through increased vane-to-air interface area.

11. The integrated speaker construction as defined in claim 5 further comprising a power transformer mounted in thermal engagement with at least one of said cooling vanes so as to enable cooling of said power transformer via said cooling vanes.

* * * * *